(12) United States Patent
Takenaka

(10) Patent No.: US 10,476,531 B2
(45) Date of Patent: Nov. 12, 2019

(54) HIGH-FREQUENCY FRONT-END CIRCUIT

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/843,541

(22) Filed: Dec. 15, 2017

(65) Prior Publication Data

US 2018/0109274 A1 Apr. 19, 2018

Related U.S. Application Data

(63) Continuation of application No. PCT/JP2016/067160, filed on Jun. 9, 2016.

(30) Foreign Application Priority Data

Jun. 16, 2015 (JP) ................. 2015-120753

(51) Int. Cl.
| | |
|---|---|
| H04B 1/00 | (2006.01) |
| H04L 5/14 | (2006.01) |
| H04B 1/403 | (2015.01) |
| H04B 1/52 | (2015.01) |

(Continued)

(52) U.S. Cl.
CPC ............. *H04B 1/0057* (2013.01); *H03F 1/56* (2013.01); *H03F 3/19* (2013.01); *H03F 3/60* (2013.01);

(Continued)

(58) Field of Classification Search
CPC .... H04B 1/0057; H04B 1/006; H04B 1/0458; H04B 1/401; H04B 1/403; H04B 2001/0408; H04L 5/1461
See application file for complete search history.

(56) References Cited

U.S. PATENT DOCUMENTS

2005/0197095 A1* 9/2005 Nakamata ............ H04B 1/0057
                                                                                   455/403
2011/0110452 A1* 5/2011 Fukamachi ......... H01P 1/20336
                                                                                   375/267

(Continued)

FOREIGN PATENT DOCUMENTS

| CN | 102684732 A | 9/2012 |
|---|---|---|
| CN | 102891698 A | 1/2013 |

(Continued)

OTHER PUBLICATIONS

IP.com in patents; Jul. 2, 2019 (Year: 2019).*

(Continued)

*Primary Examiner* — Benjamin H Elliott, IV
(74) *Attorney, Agent, or Firm* — Pearne & Gordon LLP

(57) ABSTRACT

A high-frequency front-end circuit includes a communication band selection circuit, a high-frequency processing circuit, and a multi-band amplifier. The multi-band amplifier amplifies high-frequency signals in a plurality of communication bands. The communication band selection circuit is connected an output end of the multi-band amplifier. The communication band selection circuit includes a communication band selection switch. The high-frequency processing circuit is connected between a first connection line connecting the multi-band amplifier and the communication band selection circuit and a ground potential. The high-frequency processing circuit includes a passive element and an impedance selection switch. The passive element is connected between the first connection line and the ground potential. A first terminal of the impedance selection switch is connected to a second connection line connecting the passive element and the first connection line, and a second terminal of the impedance selection switch is connected to the ground potential.

14 Claims, 4 Drawing Sheets

(51) Int. Cl.
- *H03F 1/56* (2006.01)
- *H03F 3/19* (2006.01)
- *H03H 7/01* (2006.01)
- *H03H 7/38* (2006.01)
- *H03H 7/46* (2006.01)
- *H04B 1/401* (2015.01)
- *H04B 1/04* (2006.01)
- *H03F 3/60* (2006.01)

(52) U.S. Cl.
CPC ........ *H03H 7/0115* (2013.01); *H03H 7/0138* (2013.01); *H03H 7/38* (2013.01); *H03H 7/463* (2013.01); *H04B 1/006* (2013.01); *H04B 1/0458* (2013.01); *H04B 1/401* (2013.01); *H04B 1/403* (2013.01); *H04B 1/52* (2013.01); *H04L 5/1461* (2013.01); *H03F 2200/111* (2013.01); *H03F 2200/387* (2013.01); *H03F 2200/451* (2013.01); *H04B 2001/0408* (2013.01)

(56) References Cited

U.S. PATENT DOCUMENTS

| | | | |
|---|---|---|---|
| 2012/0001735 A1* | 1/2012 | Fink | G06K 19/0675 340/10.4 |
| 2012/0224514 A1 | 9/2012 | Shibata | |
| 2012/0288033 A1* | 11/2012 | Stirling-Gallacher | G01S 7/03 375/322 |
| 2013/0021113 A1 | 1/2013 | Bakalski | |
| 2013/0229237 A1* | 9/2013 | Takenaka | H03F 1/22 330/311 |
| 2014/0155001 A1* | 6/2014 | de Graauw | H04B 1/40 455/73 |
| 2017/0126186 A1* | 5/2017 | Slee | H03F 1/083 |
| 2018/0091187 A1* | 3/2018 | Uejima | H04B 1/525 |
| 2018/0109274 A1* | 4/2018 | Takenaka | H04B 1/403 |

FOREIGN PATENT DOCUMENTS

| | | |
|---|---|---|
| JP | 2003-309489 A | 10/2003 |
| JP | 2013-110619 A | 6/2013 |
| JP | 2015-195449 A | 11/2015 |

OTHER PUBLICATIONS

IP.com in NPL; Jul. 2, 2019 (Year: 2019).*
IEEE Explore; Jul. 2, 2019 (Year: 2019).*
International Search Report for PCT/JP2016/067160 dated Jul. 12, 2016.
Written Opinion for PCT/JP2016/067160 dated Jul. 12, 2016.

* cited by examiner

[FIG.1]
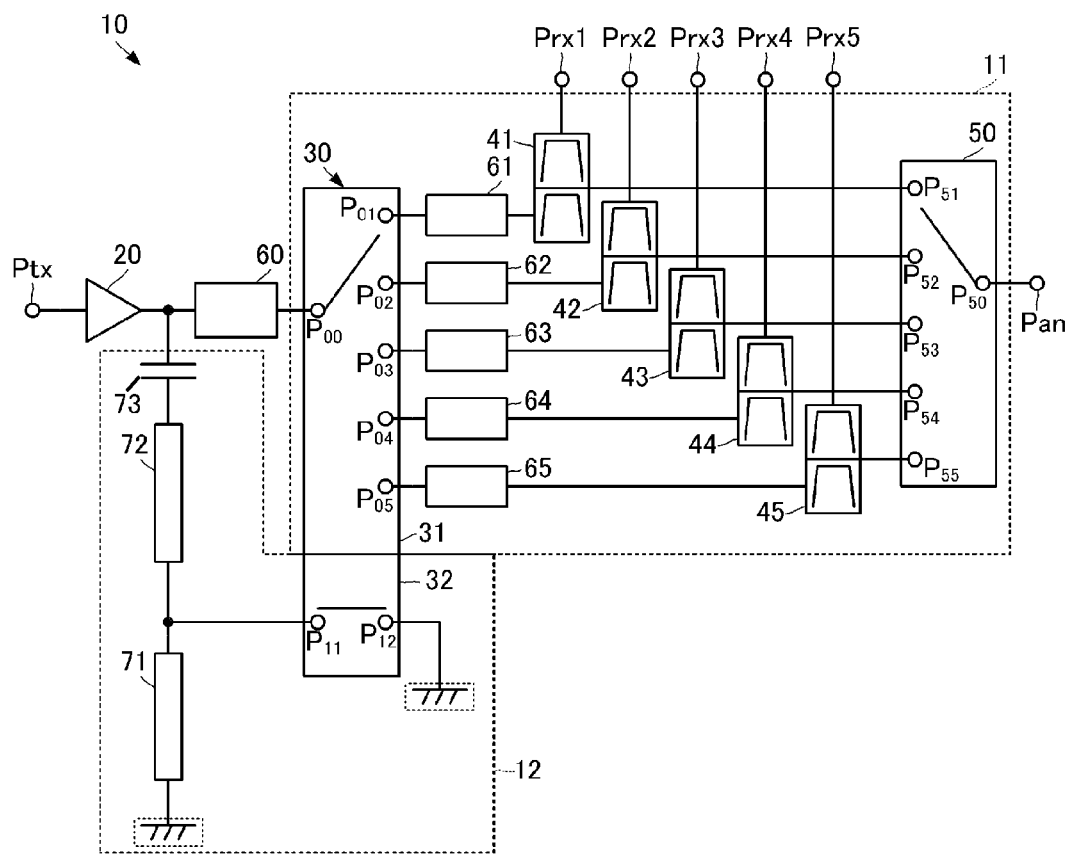

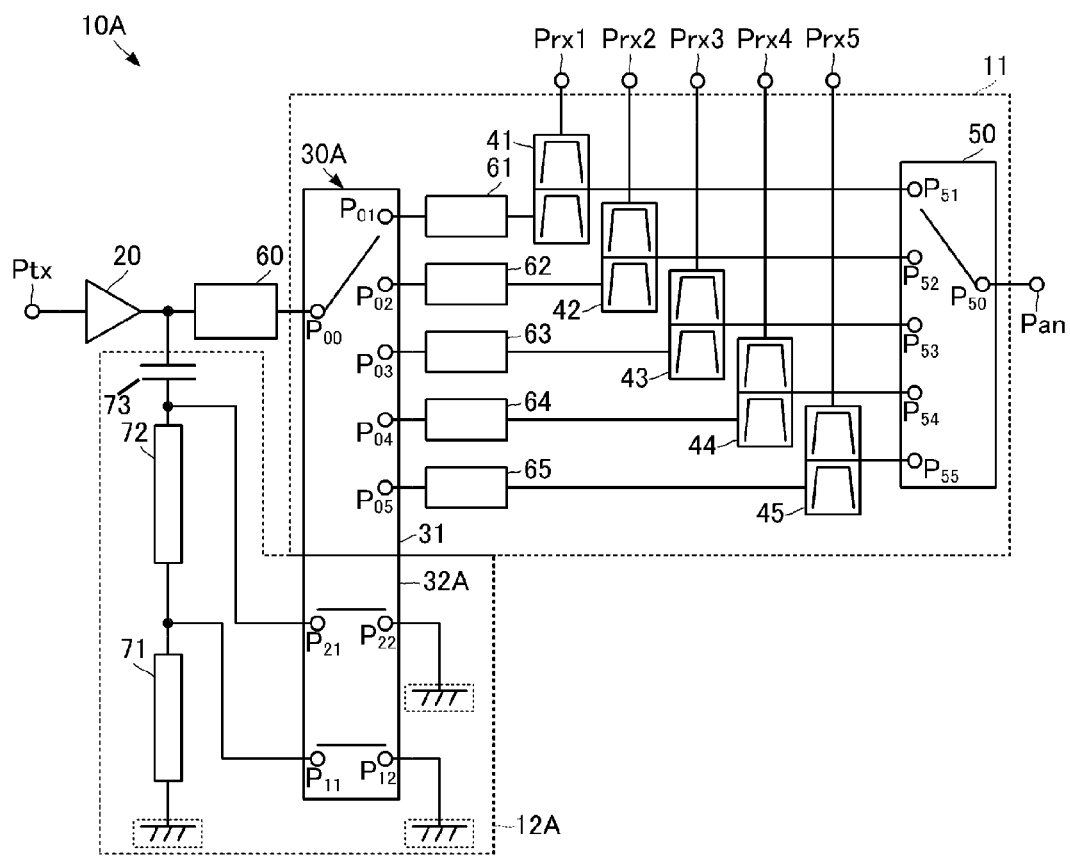
[FIG.2]

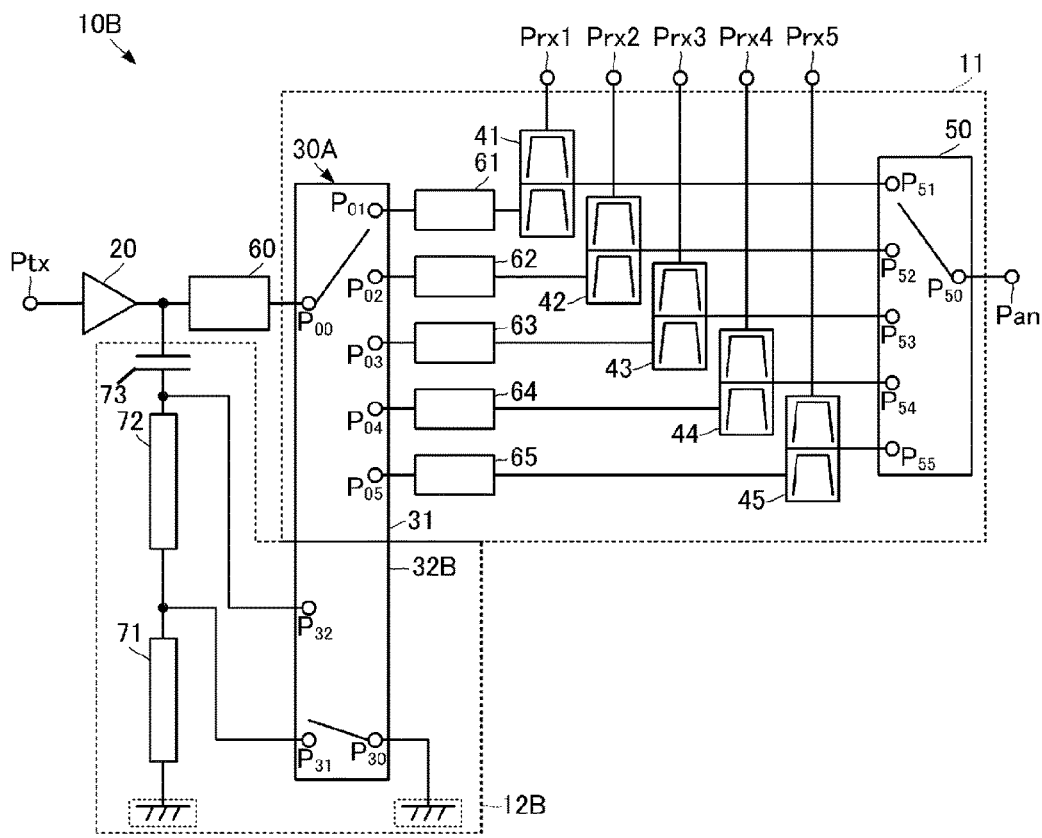
[FIG.3]

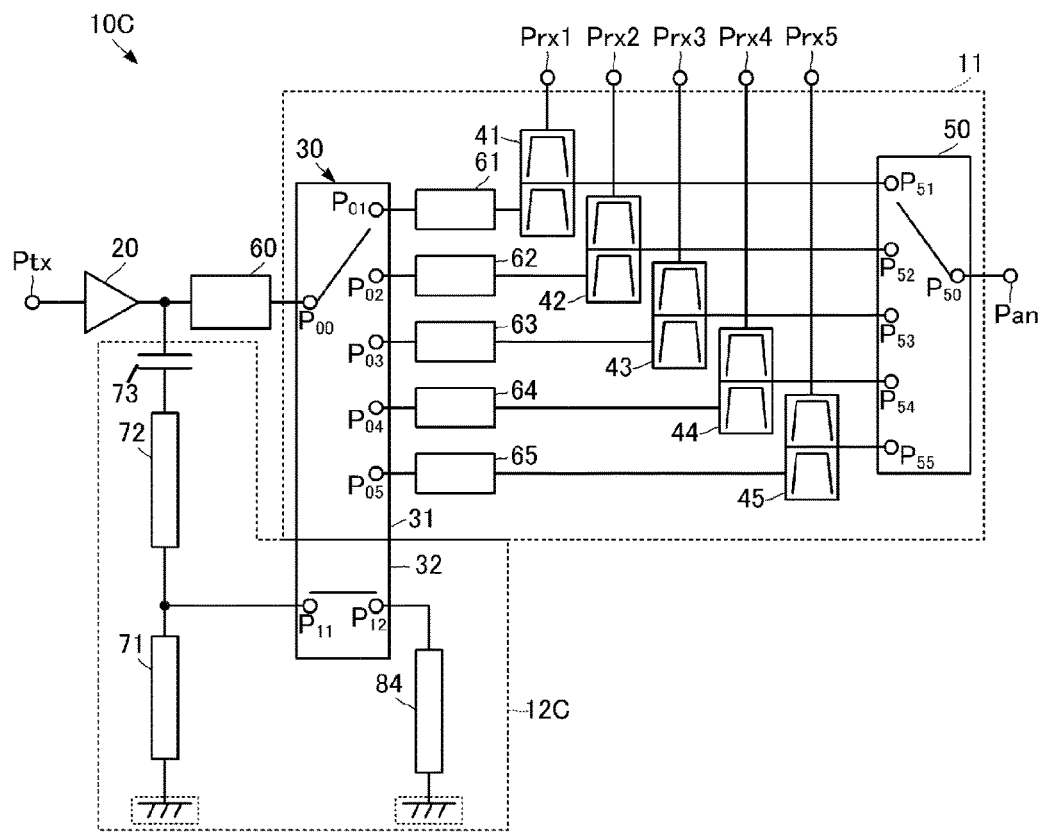

HIGH-FREQUENCY FRONT-END CIRCUIT

This application is a continuation of International Application No. PCT/JP2016/067160 filed on Jun. 9, 2016 which claims priority from Japanese Patent Application No. 2015-120753 filed on Jun. 16, 2015. The contents of these applications are incorporated herein by reference in their entireties.

BACKGROUND OF THE DISCLOSURE

Field of the Disclosure

The present disclosure relates to a high-frequency front-end circuit for amplifying and transmitting high-frequency signals in a plurality of communication bands.

Description of the Related Art

In current years, radio communication apparatuses such as mobile communication terminals have multi-band capable configurations. Multi-band capability is capability to transmit/receive signals in a plurality of communication bands using different frequency bands. For example, Patent Document 1 discloses a multi-band amplifier.

In the multi-band amplifier disclosed in Patent Document 1, a plurality of trap filters are connected to an output end of a transistor. The resonant frequencies of the trap filters are set for corresponding communication bands. The trap filters are selected by corresponding switches on the basis of a communication band to be used for transmission/reception. The selected one of the trap filters is connected to the output end of the transistor.

Patent Document 1: Japanese Unexamined Patent Application Publication No. 2013-110619

BRIEF SUMMARY OF THE DISCLOSURE

However, a high-frequency front-end circuit having the configuration disclosed in Patent Document 1 increases in size, because a switch needs to be disposed for each communication band. In addition, in a high-frequency front-end circuit having the configuration disclosed in Patent Document 1, the characteristics thereof are deteriorated under the influence of high-frequency characteristics of a switch.

It is an object of the present disclosure to provide a small-sized multi-band capable high-frequency front-end circuit having excellent high-frequency characteristics.

A high-frequency front-end circuit according to the present disclosure includes a multi-band amplifier, a communication band selection circuit, and a high-frequency processing circuit. The multi-band amplifier amplifies high-frequency signals in a plurality of communication bands including a first communication band and a second communication band not overlapping with the first frequency band. The communication band selection circuit is connected to an output end of the multi-band amplifier via a first connection line. The communication band selection circuit includes a communication band selection switch. The high-frequency processing circuit is connected to the first connection line and a ground potential. The high-frequency processing circuit includes a first passive circuit and a first switch. One end of the first passive circuit is connected to the first connection line via a second connection line, and the other end of the first passive circuit is connected to the ground potential. The first switch brings a connection between a first terminal connected to the second connection line and a second terminal connected to the ground potential into or out of conduction.

In a case where the first switch is open in this configuration, the high-frequency processing circuit functions as a circuit not including the first switch in terms of high frequencies. In a case where a circuit not including a switch is selected, a reflection and a loss caused by a switch do not occur. Bringing the first switch into or out of conduction changes the impedance frequency characteristics of the high-frequency processing circuit.

In the high-frequency front-end circuit according to the present disclosure, the first switch and the communication band selection switch are preferably incorporated into a single switching element.

With this configuration, a circuit module is reduced in size as compared with a configuration in which the first switch and the communication band selection switch are separately provided.

The high-frequency front-end circuit according to the present disclosure preferably further includes a second passive circuit that is provided on the second connection line and is connected to the first connection line and the first passive circuit.

With this configuration, an impedance range realizable in the high-frequency processing circuit can be extended.

The high-frequency front-end circuit according to the present disclosure preferably further includes a second switch configured to bring a connection between a third terminal connected to the second connection line connecting the second passive circuit and the first connection line and a fourth terminal connected to the ground potential into or out of conduction.

With this configuration, a larger number of communication bands can be supported.

In the high-frequency front-end circuit according to the present disclosure, the first switch, the second switch, and the communication band selection switch are preferably incorporated into a single switching element.

With this configuration, the circuit module of a high-frequency front-end circuit capable of supporting a larger number of communication bands can be reduced in size.

In the high-frequency front-end circuit according to the present disclosure, the high-frequency processing circuit preferably has a stop band that can be changed in accordance with a connection state of the first switch, and a high-frequency signal in a frequency band in the first or second communication band is preferably attenuated in accordance with the stop band.

With this configuration, high-frequency characteristics can be further improved.

In the high-frequency front-end circuit according to the present disclosure, the high-frequency processing circuit preferably includes an LC series resonant circuit and a resonant frequency of the LC series resonant circuit is preferably located in the stop band.

With this configuration, high-frequency characteristics can be further improved.

The high-frequency front-end circuit according to the present disclosure preferably further includes a first branching circuit and a second branching circuit. The first branching circuit is connected to the communication band selection circuit and includes a first transmission filter and a first reception filter which are configured to transmit a high-frequency signal in the first communication band. The second branching circuit is connected to the communication band selection circuit and includes a second transmission filter and a second reception filter which are configured to transmit a high-frequency signal in the second communication band. The high-frequency front-end circuit according to the present disclosure preferably further includes a control circuit. The control circuit selects a connection state of the first switch such that the stop band includes a pass band of the first reception filter when the communication band selection circuit is electrically disconnected from the first branching circuit and is electrically connected to the second branching circuit. The control circuit selects a connection state of the first switch such that the stop band does not include the pass band of the first reception filter when the communication band selection circuit is electrically connected to the first branching circuit and is electrically disconnected from the second branching circuit.

In this configuration, a branching circuit for separating a transmission signal and a reception signal is provided for each of a plurality of communication bands. With this configuration, high-frequency characteristics are improved in each communication band.

According to the present disclosure, it is possible to provide a small-sized multi-band capable high-frequency front-end circuit having excellent high-frequency characteristics.

BRIEF DESCRIPTION OF THE SEVERAL VIEWS OF THE DRAWINGS

FIG. 1 is a circuit diagram of a high-frequency front-end circuit according to a first embodiment of the present disclosure.

FIG. 2 is a circuit diagram of a high-frequency front-end circuit according to a second embodiment of the present disclosure.

FIG. 3 is a circuit diagram of a high-frequency front-end circuit according to a third embodiment of the present disclosure.

FIG. 4 is a circuit diagram of a high-frequency front-end circuit according to a fourth embodiment of the present disclosure.

DETAILED DESCRIPTION OF THE DISCLOSURE

A high-frequency front-end circuit according to a first embodiment of the present disclosure will be described with reference to the drawings. FIG. 1 is a circuit diagram of a high-frequency front-end circuit according to the first embodiment of the present disclosure.

As illustrated in FIG. 1, a high-frequency front-end circuit 10 includes a communication band selection circuit 11, a high-frequency processing circuit 12, and a multi-band amplifier 20.

The multi-band amplifier 20 performs amplification in a plurality of communication bands. Specifically, the multi-band amplifier 20 amplifies transmission signals (high-frequency signals) in a plurality of communication bands. The frequency bands of a plurality of communication bands differ from one another. The multi-band amplifier 20 is represented by a single circuit symbol in FIG. 1, but may be the combination of a high-band amplifier and a low-band amplifier or the combination of a high-output amplifier and a low-output amplifier. An input end of the multi-band amplifier 20 is connected to a transmission signal input terminal Ptx of the high-frequency front-end circuit 10.

The communication band selection circuit 11 includes a transmission-side switch 31, duplexers 41, 42, 43, 44, and 45, an antenna-side switch 50, and discrete matching circuits 61, 62, 63, 64, and 65.

The transmission-side switch 31 has a common terminal $P_{00}$, and selection target terminals $P_{01}$, $P_{02}$, $P_{03}$, $P_{04}$, and $P_{05}$. The transmission-side switch 31 constituting a communication band selection switch connects one of the selection target terminals $P_{01}$, $P_{02}$, $P_{03}$, $P_{04}$, and $P_{05}$ to the common terminal $P_{00}$ in accordance with a band selection signal transmitted from a control circuit. The common terminal $P_{00}$ is connected to an output end of the multi-band amplifier 20 via a common matching circuit 60.

The common matching circuit 60 performs impedance matching upon transmission signals in all communication bands (for example, communication bands A, B, C, D, and E) used in the high-frequency front-end circuit 10. The common matching circuit 60 is realized by a circuit including passive elements such as an inductor and a capacitor.

The antenna-side switch 50 constituting the communication band selection circuit 11 has a common terminal $P_{50}$ and selection target terminals $P_{51}$, $P_{52}$, $P_{53}$, $P_{54}$, and $P_{55}$. The antenna-side switch 50 connects one of the selection target terminals $P_{51}$, $P_{52}$, $P_{53}$, $P_{54}$, and $P_{55}$ to the common terminal $P_{50}$ in accordance with a band selection signal transmitted from a control circuit. The common terminal $P_{50}$ is connected to an antenna terminal Pan of the high-frequency front-end circuit 10.

The selection target terminal $P_{51}$ of the antenna-side switch 50 is selected along with the selection target terminal $P_{01}$ of the transmission-side switch 31 in accordance with a band selection signal transmitted from a control circuit. The selection target terminal $P_{52}$ of the antenna-side switch 50 is selected along with the selection target terminal $P_{02}$ of the transmission-side switch 31. The selection target terminal $P_{53}$ of the antenna-side switch 50 is selected along with the selection target terminal $P_{03}$ of the transmission-side switch 31. The selection target terminal $P_{54}$ of the antenna-side switch 50 is selected along with the selection target terminal $P_{04}$ of the transmission-side switch 31. The selection target terminal $P_{55}$ of the antenna-side switch 50 is selected along with the selection target terminal $P_{05}$ of the transmission-side switch 31.

A transmission filter included in a duplexer 41 for separating a transmission signal and a reception signal is connected between the selection target terminal $P_{01}$ and the selection target terminal $P_{51}$. At that time, the discrete matching circuit 61 is connected between the selection target terminal $P_{01}$ and the transmission filter. The discrete matching circuit 61 performs impedance matching upon a transmission signal in the communication band A. The discrete matching circuit 61 is realized by a circuit including passive elements such as an inductor and a capacitor. In the frequency band of a transmission signal in the communication band A, an impedance seen from the transmission signal input terminal Ptx to the antenna terminal Pan is matched by the common matching circuit 60 and the discrete matching circuit 61.

A reception filter included in the duplexer 41 is connected between the selection target terminal $P_{51}$ and a reception signal output terminal Prx1 of the high-frequency front-end circuit 10.

A transmission filter included in the duplexer 42 is connected between the selection target terminal $P_{02}$ and the selection target terminal $P_{52}$. At that time, a discrete matching circuit 62 is connected between the selection target terminal $P_{02}$ and the transmission filter. The discrete matching circuit 62 performs impedance matching upon a transmission signal in the communication band B. The discrete matching circuit 62 is realized by a circuit including passive elements such as an inductor and a capacitor. In the frequency band of a transmission signal in the communication band B, an impedance seen from the transmission signal input terminal Ptx to the antenna terminal Pan is matched by the common matching circuit 60 and the discrete matching circuit 62.

A reception filter included in the duplexer 42 is connected between the selection target terminal $P_{52}$ and a reception signal output terminal Prx2 of the high-frequency front-end circuit 10.

A transmission filter included in the duplexer 43 is connected between the selection target terminal $P_{03}$ and the selection target terminal $P_{53}$. At that time, a discrete matching circuit 63 is connected between the selection target terminal $P_{03}$ and the transmission filter. The discrete matching circuit 63 performs impedance matching upon a transmission signal in the communication band C. The discrete matching circuit 63 is realized by a circuit including passive elements such as an inductor and a capacitor. In the frequency band of a transmission signal in the communication band C, an impedance seen from the transmission signal input terminal Ptx to the antenna terminal Pan is matched by the common matching circuit 60 and the discrete matching circuit 63.

A reception filter included in the duplexer 43 is connected between the selection target terminal $P_{53}$ and a reception signal output terminal Prx3 of the high-frequency front-end circuit 10.

A transmission filter included in the duplexer 44 is connected between the selection target terminal $P_{04}$ and the selection target terminal $P_{54}$. At that time, a discrete matching circuit 64 is connected between the selection target terminal $P_{04}$ and the transmission filter. The discrete matching circuit 64 performs impedance matching upon a transmission signal in the communication band D. The discrete matching circuit 64 is realized by a circuit including passive elements such as an inductor and a capacitor. In the frequency band of a transmission signal in the communication band D, an impedance seen from the transmission signal input terminal Ptx to the antenna terminal Pan is matched by the common matching circuit 60 and the discrete matching circuit 64.

A reception filter included in the duplexer 44 is connected between the selection target terminal $P_{54}$ and a reception signal output terminal Prx4 of the high-frequency front-end circuit 10.

A transmission filter included in the duplexer 45 is connected between the selection target terminal $P_{05}$ and the selection target terminal $P_{55}$. At that time, the discrete matching circuit 65 is connected between the selection target terminal $P_{05}$ and the transmission filter. A discrete matching circuit 65 performs impedance matching upon a transmission signal in the communication band E. The discrete matching circuit 65 is realized by a circuit including passive elements such as an inductor and a capacitor. In the frequency band of a transmission signal in the communication band E, an impedance seen from the transmission signal input terminal Ptx to the antenna terminal Pan is matched by the common matching circuit 60 and the discrete matching circuit 65.

A reception filter included in the duplexer 45 is connected between the selection target terminal $P_{55}$ and a reception signal output terminal Prx5 of the high-frequency front-end circuit 10.

An output end of the multi-band amplifier 20 and the communication band selection circuit 11 (the common terminal $P_{00}$ of the transmission-side switch 31) are connected to each other via a first connection line.

The high-frequency processing circuit 12 is connected to the first connection line and a ground potential. The high-frequency processing circuit 12 includes passive elements 71 and 72, a capacitor 73, and an impedance selection switch 32. The impedance selection switch 32 constitutes a "first switch" according to the present disclosure. The capacitor 73 and the passive element 71 constitute a "first passive circuit" according to the present disclosure. The passive element 72 constitutes a "second passive circuit" according to the present disclosure.

The passive elements 71 and 72 and the capacitor 73 are connected in series in this order. The passive element 71 in this series circuit is connected to the ground potential, and one end of the capacitor 73 in this series circuit is connected to the first connection line. The passive elements 71 and 72 are inductors. The series circuit is therefore an LC series resonant circuit having one end connected to the ground potential. The high-frequency processing circuit 12 functions as a trap filter having a stop band formed by the resonant frequency of the LC series resonant circuit. By setting a target frequency band in the stop band of the high-frequency processing circuit 12, the high-frequency processing circuit 12 functions as a trap filter having a stop band in the target frequency band. The resonant frequency of this series circuit is substantially the same as the frequency of a reception signal in a target communication band (for example, the communication band A). A trap filter including an LC series resonant circuit having one end connected to the ground potential can have a relatively wide stop band, and therefore preferably handle reception signals in not a single communication band but a plurality of communication bands. On the condition that a sufficient attenuation function of attenuating the power of a signal by 10 dB or greater at the frequency of a reception signal in a target communication band can be realized, a communication band including a plurality of target communication bands may be set.

The impedance selection switch 32 has a first terminal $P_{11}$ and a second terminal $P_{12}$. A connection between the first terminal $P_{11}$ and the second terminal $P_{12}$ is brought into or out of conduction in accordance with the above-described band selection signal. The first terminal $P_{11}$ is connected to a line (conductor) to which the passive elements 71 and the passive element 72 on a second connection line connecting the first connection line and the passive element 71 are connected. The second terminal $P_{12}$ is connected to the ground potential.

In a case where the impedance selection switch 32 is open, the high-frequency processing circuit 12 is formed by the series circuit of the passive elements 71 and 72 and the capacitor 73.

In a case where the impedance selection switch 32 is in a conductive state, the high-frequency processing circuit 12 is formed by the series circuit of the passive element 72 and the capacitor 73. This series circuit functions as a trap filter in a target frequency band. The resonant frequency of this series circuit is substantially the same as the frequency of a reception signal in a target communication band (for example, the communication band B). The number of target communication bands is not limited to one. On the condition that a sufficient trap function can be realized at frequencies of reception signals in a plurality of communication bands, these communication bands may be set as target communication bands. An inductor is preferably used as the passive element 72, because the series circuit of the passive element 72 that is an inductor and the capacitor 73 can be an LC series circuit having a resonant frequency.

A resonant frequency in a case where the impedance selection switch 32 opens and a resonant frequency in a case where the impedance selection switch 32 is in a conductive state are set to differ from each other. For example, it is assumed that one of these resonant frequencies is closer to reception frequency bands in the communication bands A, B, and C and the other one of them is closer to reception frequency bands in the communication bands D and E. The resonant frequency in case where the impedance selection switch 32 is in a conductive state is determined on the basis of frequencies of reception signals in the communication bands A, B, and C. The resonant frequency in a case where the impedance selection switch 32 opens is determined on the basis of frequencies of reception signals in the communication bands D and E.

In a case where a signal in one of the communication bands D and E is transmitted/received, a control circuit selects the state of the impedance selection switch 32 in the high-frequency processing circuit 12 to an open state. As a result, the harmonic of a transmission signal close to or overlapping with a reception frequency band is attenuated and the high-frequency characteristics of the high-frequency front-end circuit 10 are improved. The high-frequency characteristics are based on an insertion loss, an isolation between transmission and reception sides, reception sensitivity, and the like.

In a case where a signal in one of the communication bands A, B, and C is transmitted/received, a control circuit selects the state of the impedance selection switch 32 in the high-frequency processing circuit 12 to an open state. As a result, the harmonic of a transmission signal close to or overlapping with a reception frequency band is attenuated and the high-frequency characteristics of the high-frequency front-end circuit 10 are improved. At that time, since a high-frequency signal is not transmitted to the impedance selection switch 32 that is in the open state in the high-frequency processing circuit 12, a loss caused by a switch does not occur and more excellent high-frequency characteristics can be realized. The following configuration is preferably provided. A first communication band (higher-frequency communication band) includes the communication bands A, B, and C having reception frequencies close to one another. A second communication band (lower-frequency communication band) is lower than the first communication band and includes the communication bands D and E having reception frequencies close to each other. In a case where a second or third harmonic of a transmission frequency in the second communication band overlaps with a reception frequency in the first communication band, the stop band of the high-frequency processing circuit 12 in which the impedance selection switch 32 is open overlaps with a reception frequency in the first communication band. In a case where the impedance selection switch 32 is in a conductive state, the stop band of the high-frequency processing circuit 12 does not overlap with the second communication band and overlaps with the second or third harmonic of a transmission frequency in the first communication band.

With a configuration according to this embodiment, the influence of a switch on high-frequency processing can be suppressed in all communication bands. The high-frequency characteristics of the high-frequency front-end circuit 10 are therefore improved. At that time, for a communication band susceptible to the frequency band of a reception signal, a mode in which the impedance selection switch 32 is open is set. As a result, the high-frequency front-end circuit 10 having more excellent high-frequency characteristics can be realized.

With a configuration according to this embodiment, the number of switches can be reduced and the high-frequency front-end circuit 10 can be reduced in size.

In a case where the passive element 71 is an inductor as described above, more excellent high-frequency characteristics can be realized for a low-band communication signal. By using a capacitor as the passive element 71, more excellent high-frequency characteristics can be realized for a high-band communication signal.

Each of the passive elements 71 and 72 may be a passive circuit including the combination of a plurality of passive elements. Each of the passive elements 71 and 72 may be a mount component and be realized by a conductor pattern formed at a laminate constituting the high-frequency front-end circuit 10.

The transmission-side switch 31 and the impedance selection switch 32 may be separately provided or integrated as illustrated in FIG. 1. That is, the transmission-side switch 31 and the impedance selection switch 32 may be realized by a switching IC 30 that is a single switching element. In this case, a common band selection signal input terminal can be provided and the high-frequency front-end circuit 10 can be further reduced in size.

Next, a high-frequency front-end circuit according to a second embodiment of the present disclosure will be described with reference to the drawings. FIG. 2 is a circuit diagram of a high-frequency front-end circuit according to the second embodiment of the present disclosure.

As illustrated in FIG. 2, a high-frequency front-end circuit 10A differs from the high-frequency front-end circuit 10 according to the first embodiment in the configuration of a high-frequency processing circuit 12A. The other configuration is the same as that of the high-frequency front-end circuit 10.

The high-frequency processing circuit 12A differs from the high-frequency processing circuit 12 according to the first embodiment in the configuration of an impedance selection switch 32A.

The impedance selection switch 32A has the first terminal $P_{11}$, the second terminal $P_{12}$, a third terminal $P_{21}$, and a fourth terminal $P_{22}$. A connection between the first terminal $P_{11}$ and the second terminal $P_{12}$ is brought into or out of conduction in accordance with the above-described band selection signal. The first terminal $P_{11}$ is connected to a line (conductor) to which the passive elements 71 and the passive element 72 on a second connection line connecting the first connection line and the passive element 71 are connected. The second terminal $P_{12}$ is connected to the ground potential.

A connection between the third terminal $P_{21}$ and the fourth terminal $P_{22}$ is brought into or out of conduction in accordance with the above-described band selection signal. The third terminal $P_{21}$ and the fourth terminal $P_{22}$ constitute a "second switch" according to the present disclosure. The third terminal $P_{21}$ is connected to a line (conductor) to which the passive element 72 and the capacitor 73 on the second connection line are connected. The fourth terminal $P_{22}$ is connected to the ground potential.

A switch having the first terminal $P_{11}$ and the second terminal $P_{12}$ and a switch having the third terminal $P_{21}$ and the fourth terminal $P_{22}$ are controlled by a control circuit such that both of them are open or one of them is open and the other one of them is in a conductive state.

With this configuration, the number of types of circuit configurations realized by the high-frequency processing circuit 12A can be increased. In a circuit configuration of one type, a switch is not used. The high-frequency front-end circuit 10A therefore can obtain an operational effect similar to that of the high-frequency front-end circuit 10 according to the first embodiment. The increase in the number of selectable circuit configuration types of the high-frequency processing circuit 12A can provide the following additional effects: (A) a larger number of communication bands can be supported, and (B) more excellent high-frequency characteristics can be realized.

Next, a high-frequency front-end circuit according to a third embodiment of the present disclosure will be described with reference to the drawings. FIG. 3 is a circuit diagram of a high-frequency front-end circuit according to the third embodiment of the present disclosure.

As illustrated in FIG. 3, a high-frequency front-end circuit 10B differs from the high-frequency front-end circuit 10A according to the second embodiment in the configuration of a high-frequency processing circuit 12B. The other configuration is the same as that of the high-frequency front-end circuit 10A.

The high-frequency processing circuit 12B differs from the high-frequency processing circuit 12A according to the second embodiment in the configuration of an impedance selection switch 32B.

The impedance selection switch 32B has a fifth terminal $P_{30}$, a sixth terminal $P_{31}$, and a seventh terminal $P_{32}$. One of the sixth terminal $P_{31}$ and the seventh terminal $P_{32}$ is selectively connected to the fifth terminal $P_{30}$ in accordance with the above-described band selection signal. The fifth terminal $P_{30}$ is connected to a ground potential. The sixth terminal $P_{31}$ is connected to a line (conductor) to which the passive elements 71 and the passive element 72 on a second connection line connecting the first connection line and the passive element 71 are connected. The seventh terminal $P_{32}$ is connected to a line to which the passive element 72 and the capacitor 73 on the second connection line are connected.

The high-frequency front-end circuit 10B having the above-described configuration can obtain an operational effect similar to that of the high-frequency front-end circuit 10A according to the second embodiment. The number of terminals of the impedance selection switch 32B can be set to three, and the impedance selection switch 32B can therefore be reduced in size as compared with the impedance selection switch 32A having four terminals. As a result, the high-frequency front-end circuit 10B can be further reduced in size.

Next, a high-frequency front-end circuit according to a fourth embodiment of the present disclosure will be described with reference to the drawings. FIG. 4 is a circuit diagram of a high-frequency front-end circuit according to the fourth embodiment of the present disclosure.

As illustrated in FIG. 4, a high-frequency front-end circuit 10C differs from the high-frequency front-end circuit 10 according to the first embodiment in the configuration of a high-frequency processing circuit 12C. The other configuration is the same as that of the high-frequency front-end circuit 10.

The high-frequency processing circuit 12C differs from the high-frequency processing circuit 12 according to the first embodiment in that a passive element 84 is added. The passive element 84 is connected between the second terminal $P_{12}$ and the ground potential. The passive element 84 differs from the passive element 71. For example, in a case where the passive element 71 is an inductor, the passive element 84 is a capacitor. Even if the passive element 71 and the passive element 84 have the same element type, the element values thereof are different from each other.

With this configuration, the resonant frequency of the high-frequency processing circuit 12C can be set to a desired value with more certainty. As a result, the high-frequency front-end circuit 10C having more excellent high-frequency characteristics can be realized.

The configuration of the high-frequency processing circuit 12C according to the fourth embodiment can be applied to the high-frequency processing circuit 12A according to the second embodiment and the high-frequency processing circuit 12B according to the third embodiment.

10, 10A, 10B, and 10C high-frequency front-end circuit
11 communication band selection circuit
12, 12A, 12B, and 12C high-frequency processing circuit
20 multi-band amplifier
30 switching IC
31 transmission-side switch
32, 32A, and 32B impedance selection switch
41, 42, 43, 44, and 45 duplexer
50 antenna-side switch
60 common matching circuit
61, 62, 63, 64, and 65 discrete matching circuit
71, 72, and 84 passive element
73 capacitor
$P_{00}$ common terminal
$P_{01}$, $P_{02}$, $P_{03}$, $P_{04}$, and $P_{05}$ selection target terminal
$P_{11}$ first terminal
$P_{12}$ second terminal
$P_{21}$ third terminal
$P_{22}$ fourth terminal
$P_{30}$ fifth terminal
$P_{31}$ sixth terminal
$P_{32}$ seventh terminal
$P_{50}$ common terminal
$P_{51}$, $P_{52}$, $P_{53}$, $P_{54}$, and $P_{55}$ selection target terminal
Pan antenna terminal
Prx1, Prx2, Prx3, Prx4, and Prx5 reception signal output terminal
Ptx transmission signal input terminal

The invention claimed is:

1. A high-frequency front-end circuit comprising:
   a multi-band amplifier configured to amplify high-frequency signals in a plurality of communication bands including a first communication band and a second communication band that does not overlap the first communication band;
   a communication band selection circuit comprising a communication band selection switch, the communication band selection circuit being connected to an output of the multi-band amplifier via a first connection line;
   a high-frequency processing circuit comprising a first passive circuit connected to the first connection line at a first end and to ground at a second end; and
   a first switch connected to the first end of the first passive circuit at a first terminal and to ground at a second terminal.

2. The high-frequency front-end circuit according to claim 1, wherein the first switch and the communication band selection switch are formed together as a single switching circuit element.

3. The high-frequency front-end circuit according to claim 1, further comprising a second passive circuit connected to the first connection line at a first end and to the first passive circuit at second end.

4. The high-frequency front-end circuit according to claim 3, further comprising a second switch connected to the first end of the second passive circuit at a third terminal and to ground at a fourth terminal.

5. The high-frequency front-end circuit according to claim 4, wherein the first switch, the second switch, and the communication band selection switch are formed together as a single switching circuit element.

6. The high-frequency front-end circuit according to claim 3, wherein the first switch further comprises a third terminal, the third terminal being connected to a first end of the second passive circuit.

7. The high-frequency front-end circuit according to claim 3, wherein the high-frequency processing circuit further comprises a third passive circuit connected between the second terminal of the first switch and ground.

8. The high-frequency front-end circuit according to claim 1, wherein the first passive circuit comprises an inductor.

9. The high-frequency front-end circuit according to claim 3, wherein the first passive circuit and the second passive circuit each comprise an inductor.

10. The high-frequency front-end circuit according to claim 9,
wherein the high-frequency processing circuit further comprises a third passive circuit connected between the second terminal of the first switch and ground, and
wherein the third passive circuit comprises a capacitor.

11. The high-frequency front-end circuit according to claim 3, wherein the high-frequency processing circuit further comprises a capacitor connected in series between the first connection line and the second passive circuit.

12. The high-frequency front-end circuit according to claim 1,
wherein a stop band of the high-frequency processing circuit is configured to be changed in accordance with a connection state of the first switch, and
wherein the high-frequency processing circuit is configured to attenuate a high-frequency signal in the first communication band or the second communication band.

13. The high-frequency front-end circuit according to claim 12,
wherein the high-frequency processing circuit comprises an LC series resonant circuit, and
wherein a resonant frequency of the LC series resonant circuit is within the stop band.

14. The high-frequency front-end circuit according to claim 12, further comprising:
a first branching circuit connected to the communication band selection circuit, and comprising a first transmission filter and a first reception filter configured to transmit a high-frequency signal in the first communication band;
a second branching circuit connected to the communication band selection circuit, and comprising a second transmission filter and a second reception filter configured to transmit a high-frequency signal in the second communication band; and
a control circuit configured to:
select a connection state of the first switch such that the stop band includes a pass band of the first reception filter when the communication band selection circuit is electrically disconnected from the first branching circuit and is electrically connected to the second branching circuit, and
select a connection state of the first switch such that the stop band does not include the pass band of the first reception filter when the communication band selection circuit is electrically connected to the first branching circuit and is electrically disconnected from the second branching circuit.

* * * * *